United States Patent
Franca-Neto

(10) Patent No.: US 9,356,001 B2
(45) Date of Patent: May 31, 2016

(54) SEMICONDUCTOR DEVICE WITH AT LEAST ONE VOLTAGE-GUIDED CONDUCTIVE FILAMENT

(71) Applicant: HGST Netherlands B.V., Amsterdam (NL)

(72) Inventor: Luiz M. Franca-Neto, Sunnyvale, CA (US)

(73) Assignee: HGST NETHERLANDS B.V., Amsterdam (NL)

( * ) Notice: Subject to any disclaimer, the term of this patent is extended or adjusted under 35 U.S.C. 154(b) by 0 days.

(21) Appl. No.: 14/505,307

(22) Filed: Oct. 2, 2014

(65) Prior Publication Data
US 2016/0099228 A1    Apr. 7, 2016

(51) Int. Cl.
| H01L 23/48 | (2006.01) |
| H01L 25/065 | (2006.01) |
| H01L 23/00 | (2006.01) |
| H01L 25/00 | (2006.01) |
| H01L 23/31 | (2006.01) |

(Continued)

(52) U.S. Cl.
CPC .......... *H01L 25/0657* (2013.01); *H01L 21/563* (2013.01); *H01L 21/78* (2013.01); *H01L 23/3157* (2013.01); *H01L 24/11* (2013.01); *H01L 24/17* (2013.01); *H01L 24/81* (2013.01); *H01L 24/94* (2013.01); *H01L 25/50* (2013.01); H01L 2224/16145 (2013.01); H01L 2224/818 (2013.01); H01L 2224/81234 (2013.01); H01L 2224/81365 (2013.01); H01L 2225/06513 (2013.01); H01L 2225/06555 (2013.01)

(58) Field of Classification Search
CPC . H01L 23/3157; H01L 25/0657; H01L 21/56; H01L 21/78; H01L 2225/06513; H01L 2225/06555; H01L 2224/81324; H01L 2224/81365; H01L 2224/818; H01L 2224/15145; H01L 24/81; H01L 25/50; H01L 24/17; H01L 24/11; H01L 21/563; H01L 24/94; H01L 2224/81234; H01L 2224/16145
USPC ......... 257/773, 774, 686, 685, 777, 723, 724, 257/738, 734, 737, 778, E23/068
See application file for complete search history.

(56) References Cited

U.S. PATENT DOCUMENTS

| 6,646,912 B2 | 11/2003 | Hurst et al. |
| 6,984,544 B2 | 1/2006 | Cloud et al. |

(Continued)

OTHER PUBLICATIONS

Kim et al., "Novel sidewall interconnection using perpendicular circuit die with non-solder bumps for 3D chip stack," Electronic Components and Technology Conference (ECTC), 2012 IEEE 62$^{nd}$ (May 29, 2012-Jun. 1, 2012): 1245, 1249.

*Primary Examiner* — Alexander Oscar Williams
(74) *Attorney, Agent, or Firm* — Patterson & Sheridan, LLP

(57) ABSTRACT

A semiconductor device includes at least a first semiconductor die and a second semiconductor die. The first semiconductor dies comprises a first and second side, and includes at least a first contact pad located on the first side of the first semiconductor die. The second semiconductor die comprises a first and second side, and includes at least a second contact pad located on the first side of the second semiconductor die, wherein the first semiconductor die is stacked on the second semiconductor die and wherein the first side of the first semiconductor die faces the first side of the second semiconductor die. At least one voltage-guided conductive filament is created between the first contact pad and the second contact pad.

16 Claims, 9 Drawing Sheets

(51) Int. Cl.
*H01L 21/56* (2006.01)
*H01L 21/78* (2006.01)

(56) References Cited

U.S. PATENT DOCUMENTS

| | | |
|---|---|---|
| 7,910,914 B2 | 3/2011 | Tanaka et al. |
| 8,158,457 B2 | 4/2012 | Wu |
| 8,233,303 B2 | 7/2012 | Best et al. |
| 8,357,999 B2 | 1/2013 | Robinson et al. |
| 8,536,895 B2 | 9/2013 | Lu et al. |
| 8,574,992 B2 | 11/2013 | Chen et al. |
| 8,625,322 B2 | 1/2014 | Samachisa et al. |
| 2008/0182136 A1* | 7/2008 | Arnold .................. G01N 21/66 429/7 |
| 2010/0285633 A1 | 11/2010 | Sun et al. |
| 2011/0024915 A1* | 2/2011 | Brunnbauer .......... H01L 21/561 257/774 |
| 2012/0154889 A1* | 6/2012 | Matsuoka ............ G02B 26/004 359/245 |
| 2012/0201068 A1 | 8/2012 | Ware |
| 2013/0260556 A1* | 10/2013 | Farooq ................... H01L 24/03 438/667 |
| 2013/0313705 A1* | 11/2013 | Henderson ........... H01L 23/498 257/738 |

* cited by examiner

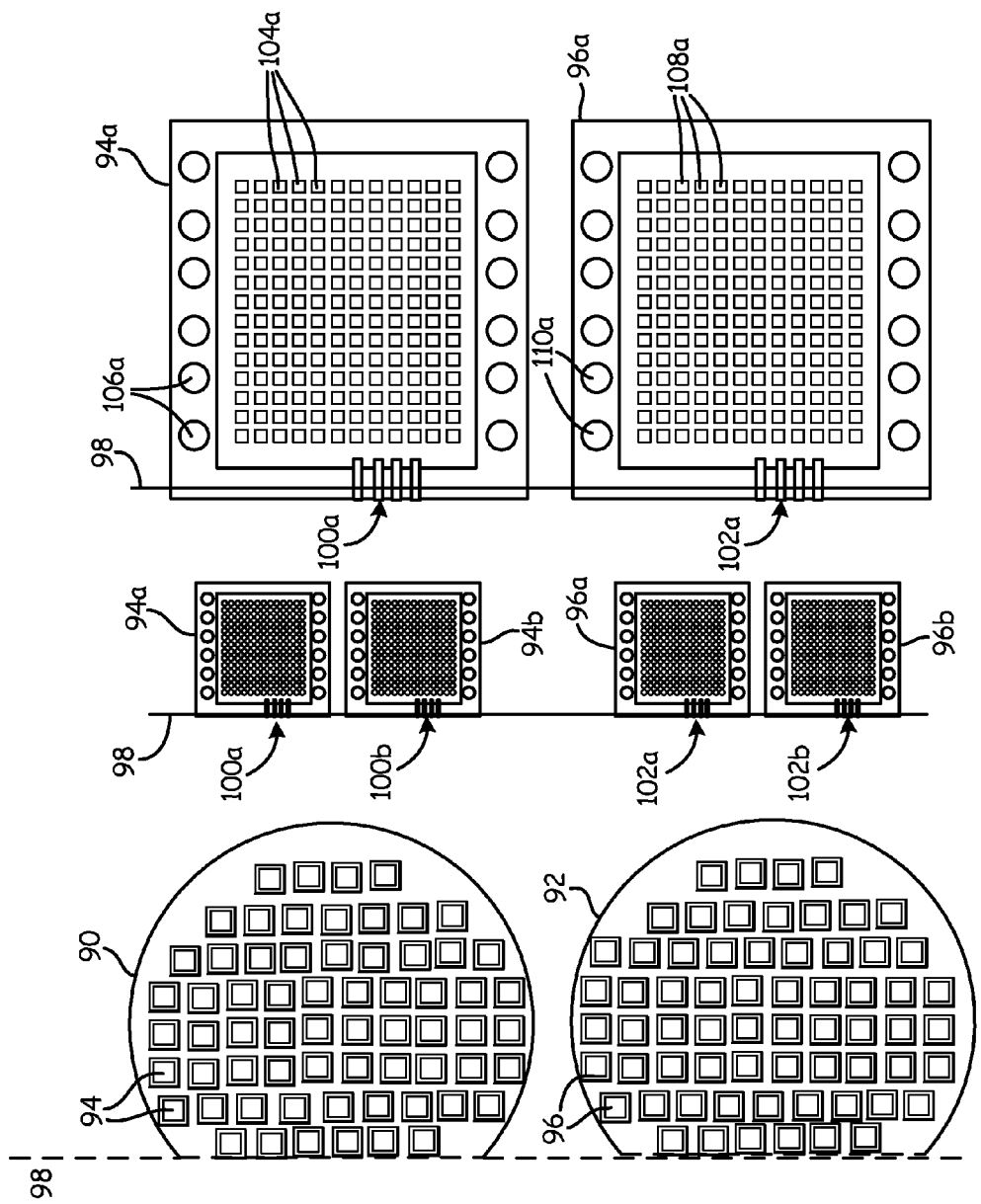

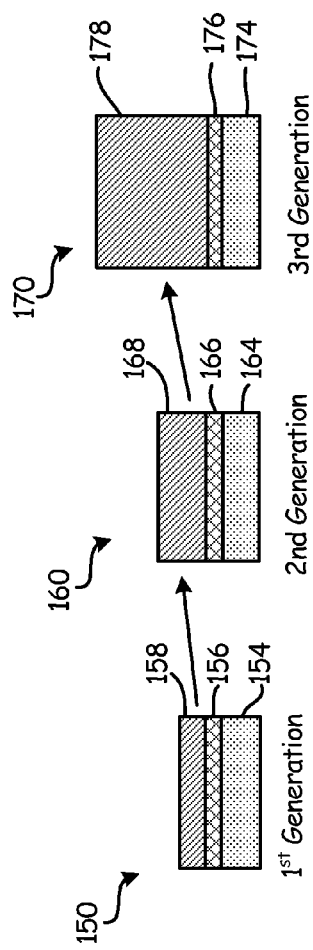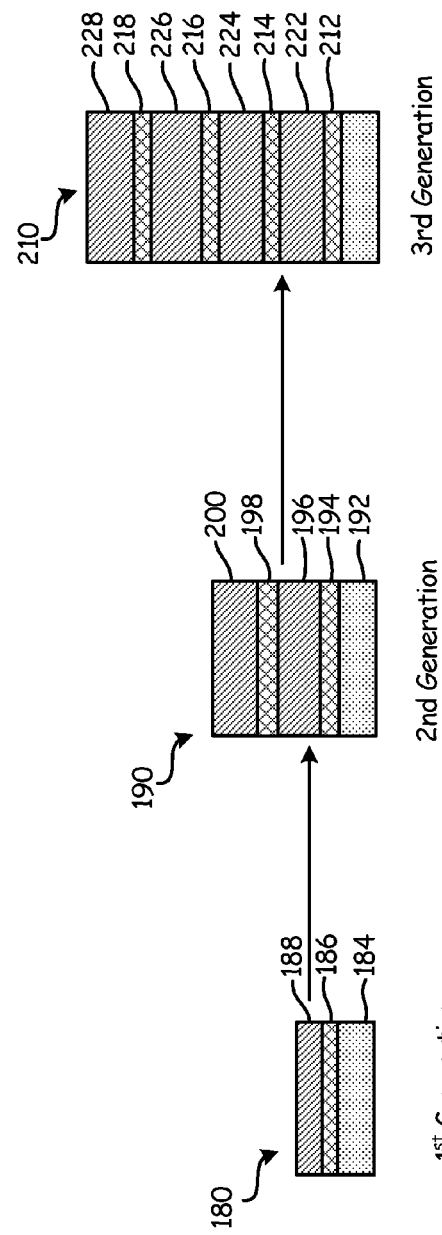

SEMICONDUCTOR DEVICE WITH AT LEAST ONE VOLTAGE-GUIDED CONDUCTIVE FILAMENT

TECHNICAL FIELD

The present disclosure relates to multi-die, stacked modules utilizing at least a first die and a second die, and in particular is related to a method and apparatus for creating electrical contacts between the at least first and second dies.

BACKGROUND

The term "die" in the field of integrated circuits refers to a small block of semiconducting material, on which a circuit is fabricated. Typically, a die is manufactured as part of a single wafer that includes a plurality of individual dies, in which fabrication techniques (e.g., deposition, removal, patterning, etc.) are utilized to design components and features of each die. The wafer is then cut via a saw-like process to separate each individual die from the larger wafer. The die is connected to a package that allows the packaged die or "chip" to be connected to a circuit board or other suitable device.

In the field of integrated circuits, there is continual pressure to improve performance, whether the integrated circuit is a microprocessor, a solid-state memory device, or some other type of device. For example, with respect to solid-state memory devices, attempts have been made to increase the density of memory devices by creating stacked 3D arrays of memory cell layers in which layer upon layer of memory cells are fabricated on a single substrate. As the number of memory cells increases, the complimentary metal-oxide semiconductor (CMOS) circuitry—a separate semiconductor layer or oftentimes separate semiconductor die fabricated on a different wafer—used to access the memory cells must be scaled (i.e., increased density) in order to provide the desired performance and latency in each generation. In other attempts to increase density, rather than increase the number of memory cell layers in the 3D memory array, a plurality of dies are stacked on top of one another, including memory cell dies, and interposer dies that utilize CMOS circuitry to boost signals. To connect adjacent dies together, the dies are placed adjacent to one another with a layer of metal interconnect located between bonding pads on each die. The metal interconnects are melted to provide bonding between the pads of the respective dies. However, alignment issues and interconnect issues require the bonding pads to remain relatively large to ensure electrical contact between the respective dies. As the density of memory cells on a die increases, additional bonding pads are required in order to provide the desired performance of the memory device, which simply cannot be fit onto the surface area of the memory cell die. Similar issues exist for other types of dies utilized in integrated circuits.

It would therefore be desirable to provide a way of forming die-to-die connections that does not require large bonding pads.

SUMMARY

According to an embodiment of the present disclosure, a semiconductor device includes at least a first semiconductor die and a second semiconductor die. The first semiconductor dies comprises a first and second side, and includes at least a first contact pad located on the first side of the first semiconductor die. The second semiconductor die comprises a first and second side, and includes at least a second contact pad located on the first side of the second semiconductor die, wherein the first semiconductor die is stacked on the second semiconductor die and wherein the first side of the first semiconductor die faces the first side of the second semiconductor die. At least one voltage-guided conductive filament is created between the first contact pad and the second contact pad.

According to another embodiment, a method of manufacturing a semiconductor device that includes at least a first die and a second die, arranged in a stacked configuration includes arranging the first die in a position adjacent to the second die. The first die is adhered to the second die, and an external voltage is selectively applied between a first contact pad located on the first die and a second contact pad located on the second die to create a first conductive filament between the first contact pad and the second contact pad.

BRIEF DESCRIPTION OF THE DRAWINGS

FIGS. 4A-4C are top views of wafers and individual dies that illustrate the cutting process prior to stacking and connecting of stacked dies according to an embodiment of the present invention.

FIGS. 6A-6B are schematic views that illustrate first and second memory device families utilizing stacked die modules according to embodiments of the present invention.

DETAILED DESCRIPTION

The present invention provides die-to-die pad connections via voltage-guided conductive filaments. The creation of the conductive filaments via this method obviates many problems encountered by typical metal interconnects formed between contact pads. One benefit is the ability to create conductive filaments despite mis-alignment between the respective dies and therefore between their respective contact pads. The voltage difference between the pads guides the growth of the conductive filament between contact pads, despite the mis-alignment. In addition, connections made via voltage-controlled filament growth allow use of smaller contact pads as compared with typical metal inter-connects between contact pads.

Figure 1A:
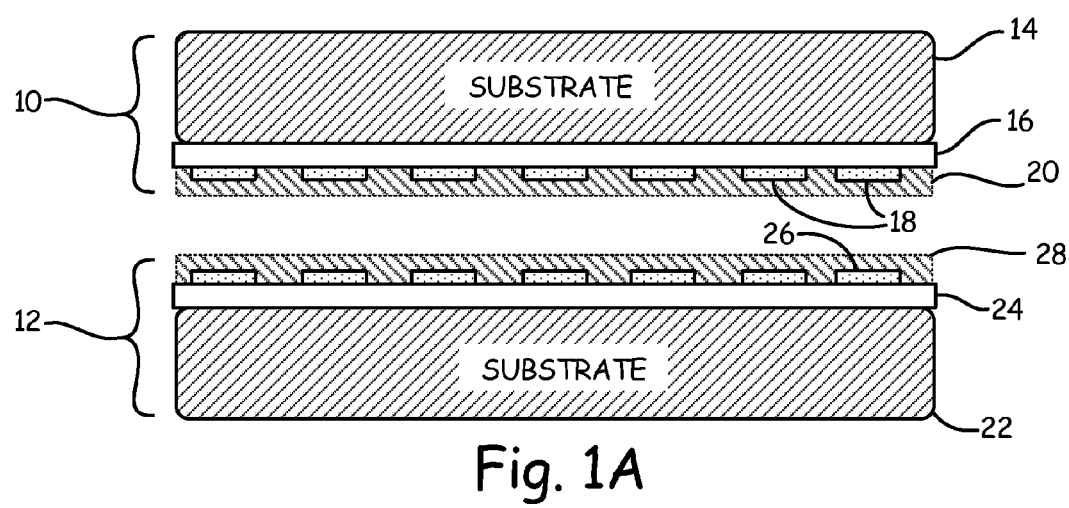
FIGS. 1A-1B are cross-sectional views of first and second semiconductor dies connected via voltage-guided conductive filaments according to an embodiment of the present invention.
Figure 1B:
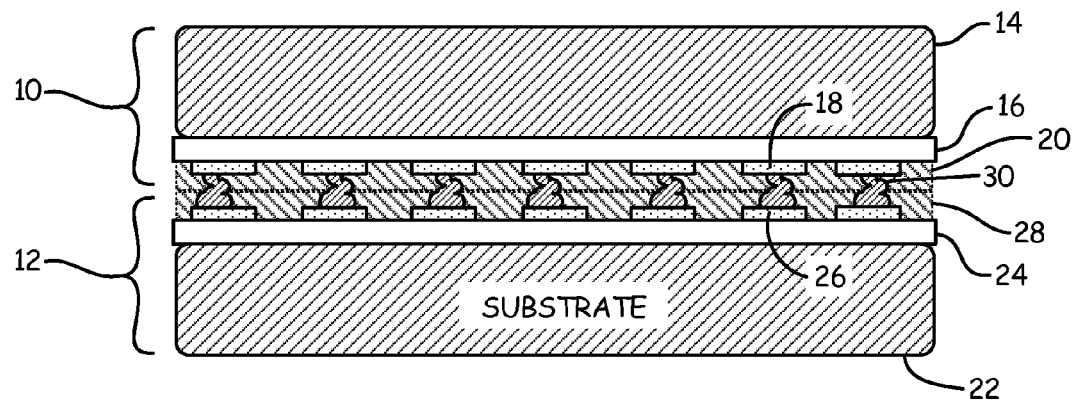

FIGS. 1A-1B are cross-sectional views of first and second semiconductor dies 10 and 12, respectively, connected via voltage-guided conductive filaments according to an embodiment of the present invention. FIG. 1A illustrates first and second semiconductor dies 10 and 12, respectively, prior to bonding and creation of conductive filaments between contact pads. FIG. 1B illustrates first and second semiconductor dies 10 and 12 after bonding and creation of conductive filaments between contact pads.

In the embodiment shown in FIGS. 1A and 1B, first semiconductor die 10 includes substrate layer 14, integrated circuit layer 16, contact pads 18 and dielectric layer 20. Likewise, second semiconductor die 12 includes substrate layer 22, integrated circuit layer 24, contact pads 26 and dielectric layer 28. Integrated circuit layers 16 and 24 are fabricated on top of substrate layers 14 and 22, respectively, via various fabrication processes. Although described generically as including the same layers (e.g., substrate layers, integrated circuit layers, etc.), the fabrication processes used to create first and second semiconductor dies 10 and 12 may be entirely different and may even be incompatible with one another. One of the benefits of the present invention is to allow semiconductor dies fabricated via incompatible processes to be connected in a stacked configuration.

In the embodiment shown in FIG. 1A, contact pads 18 are formed on integrated circuit 16, and are encapsulated by dielectric layer 20. Unlike traditional contact pads, which must be exposed in order to allow a conductive path to be formed, the embodiment shown in FIG. 1A does not require contact pads 18 be exposed. As discussed in more detail below, conductive filaments are grown through dielectric layer 20 and thus allow contact pads 18—as well as contact pads 26 located on second semiconductor die 12—to be encapsulated by dielectric layer 20. A benefit of this approach is that dielectric layers 20 and 28 provide protection to contact pads 18 and 26, respectively, prior to the stacking and creation of conductive filaments between the semiconductor dies.

In the embodiment shown in FIG. 1B, first and second semiconductor dies 10 and 12 have been stacked on top of one another, with first contact pads 18 facing second contact pads 26 via respective dielectric layers 20 and 28. Voltage-guided conductive filaments 30 are then grown between contact pads 18 located on first semiconductor die 10 and contact pads 26 located on second semiconductor die 12. Conductive filaments 30 provide an electrical connection between first semiconductor die 10 and second semiconductor die 12 that allows the respective semiconductor dies to be stacked on top of one another. Voltage-guided conductive filaments 30 are created by applying a sufficiently high voltage of the correct polarity between respective contact pads 18 and 26. The voltage difference—if sufficiently high—results in conductive filament growth through dielectric layers 20 and 28 such that a conduction path is formed between contact pads 18 and 26. In one embodiment, contact pads 18 (located on first semiconductor die 10) is comprised of a material different than that of contact pads 26 (located on opposing or second semiconductor die 12). For example, in one embodiment, contact pads 18 are comprised of an electrochemically active metal such as silver, copper, or a combination thereof, while contact pads 26 are comprised of an inert metal such as tungsten. Those skilled in the art will recognize that other combinations of materials may be utilized by contact pads 18 and 26, respectively. Similarly, in one embodiment dielectric layers 20 and 28 may be comprised of solid electrolyte/dielectric materials capable of creating oxygen-vacancy conductive paths—e.g., voltage-controlled conductive filaments. A person of skill in the art will recognize that other materials and combinations of materials may be utilized by the respective contact pads and dielectric layers to create the desired voltage-controlled conductive filaments between respective contact pads at a desired voltage.

A benefit of creating the conductive filaments 30 in this manner is that the voltage applied between the respective contact pads guides the creation of the conductive filaments. Therefore, mis-alignment between the respective contact pads is not fatal to forming a conductive path between semiconductor dies 10 and 12.

In one embodiment, prior to creation of conductive filaments 30, first semiconductor die 10 is bonded or otherwise secured to second semiconductor die 12. For example, in one embodiment bonding between first semiconductor die 10 and second semiconductor die 12 is accomplished via direct bonding of dielectric layers 20 and 28—in one embodiment following a cleaning process—under thermal treatment. Once secured by die-to-die bonding of dielectric layers 20 and 28, appropriate voltages are applied to contact pads 18 and 26 via an external voltage source (not shown) that creates conductive filaments 30 between the respective contact pads 18 and 26. In other embodiments, no bonding is provided at the intersection between first semiconductor die 10 and second semiconductor die 12, but dies are secured in place until conductive filament growth is completed. Once conductive filaments 30 have been created, external voltage applied to contact pads 18 and 26, respectively, is removed to leave the conductive filaments 30 in place indefinitely. The application of a sufficient voltage of opposite polarity used to create conductive filaments may be used to reduce the conductive filaments, thereby removing the connection path between contact pads 18 and 26, respectively. To ensure reliable operation of the stacked semiconductor device, it is necessary that voltage and current levels between the respective pads remain below the threshold used to destroy the creation of conductive filaments.

In the embodiment shown in FIGS. 1A and 1B, conductive filaments are created between isolated pairs of semiconductor dies. However, in other embodiments (discuss in more detail below with respect to FIGS. 4A-4D), conductive filaments 30 may be created between respective contact pads while first and second semiconductor dies 10 and 12, respectively, remain a part of larger wafers. In this embodiment, first and second wafers are put into direct contact with one another and adhered via a thermal treatment. The adhered wafers are placed on a platform with driving circuits to develop the conductive filaments between a first row of dies associated with first and second wafers. After the conductive filaments have been created, the row of dies is sliced or cut away from the larger wafer, which is further sliced or cut to yield pairs of dies with voltage-controlled conductive filaments formed there between. The process is repeated until all rows have had their pair of dies contacted and have been sliced. Thus, the wafer is diminished in size as rows of semiconductor dies are sliced.

Figure 2A:
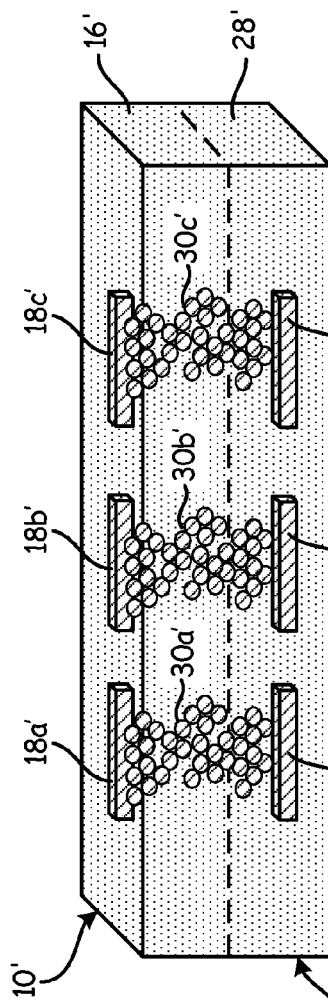
FIGS. 2A-2C are cross-sectional views illustrating in more detail conductive filament creation between contact pads of respective first and second semiconductor dies according to embodiments of the present invention.
Figure 2B:
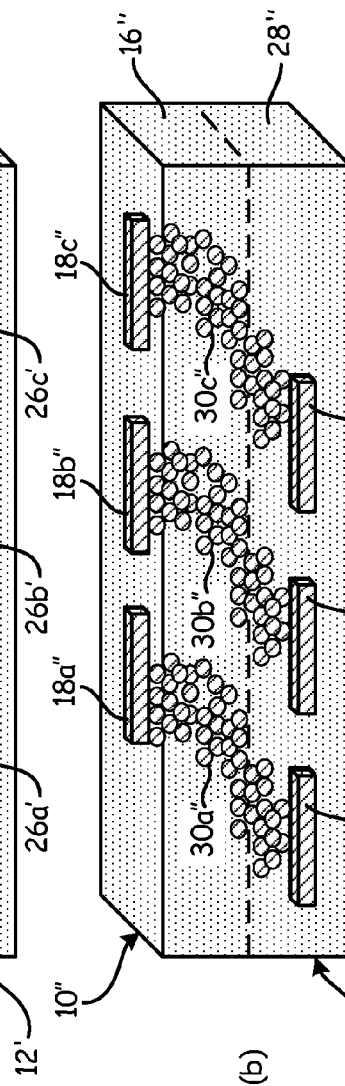
Figure 2C:
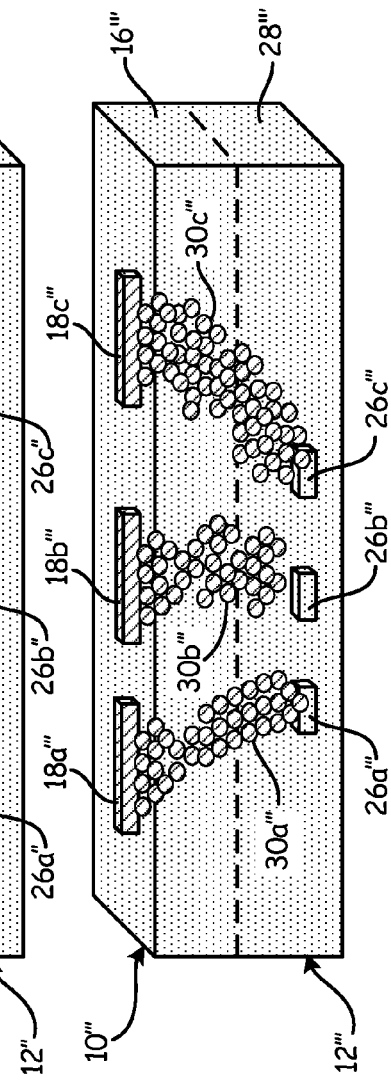

FIGS. 2A-2C are cross-sectional views illustrating in more detail voltage-guided conductive filament creation between contact pads of respective first and second semiconductor dies according to embodiments of the present invention. In the embodiment shown in FIG. 2A, semiconductor die 10' is stacked on top of semiconductor die 12'. Contact pads 18a'-18c' are aligned with contact pads 26a'-26c', respectively, and dielectric material 16' and 28' surrounds contact pads 18'-18c' and 26a'-26c'. Application of a sufficiently high voltage between contact pad 18a' and contact pad 26a' creates voltage-guided conductive filament 30a' though dielectric layers 16' and 28'. Similarly, application of a sufficiently high voltage between contact pads 18b' and 26b' as well as between contact pads 18c' and 26c' results in creation of conductive filaments 30b' and 30c', respectively. In the embodiment shown in FIG. 2A, contact pads 18a'-18c' and 26a'-26c' are aligned with one another, and thus conductive filaments 30a'-30c' are formed in a relatively straight line between respective contact pads. The embodiments described with respect to FIGS. 2B and 2C illustrate benefits of utilizing voltage-guided conductive filament growth between respective contact pads to compensate for mis-alignment between the respective contact pads and/or differences in geometry between respective pads.

In the embodiment shown in FIG. 2B, contact pads $18a''$-$18c''$ are offset from contact pads $26a''$-$26c''$. This type of mis-alignment may occur as a result of imperfect fabrication processes and/or as a result of imperfect alignment between respective first and second semiconductor dies. In other embodiments, mis-alignment may be a result of limitations on placement of contact pads within the design of respective semiconductor layers (i.e., the mis-alignment may be a design choice). Despite the mis-alignment between contact pads, conductive filaments $30a''$-$30c''$ are created along the path of least resistance (i.e., approximately shortest path) between the contact pads to which the voltage has been applied. For example, application of a sufficient voltage to contact pad $18a''$ and contact pad $26a''$ results in the creation of voltage-guided conductive filament along the most direct path between the respective contact pads.

Depending on the application and the relative location of the respective contact pads, in some embodiments the voltage-controlled conductive filaments $30a''$-$30c''$ are created simultaneously via application of voltages between each of the plurality of contact pads. In other embodiments, to prevent interaction and/or interference between adjacent contact pads, the requisite voltage is applied to specific pairs of contact pads (e.g., contact pads $18a''$ and $26a''$) to create conductive filaments between individual pairs of contact pads, before subsequently applying the requisite voltage to a different pair of contact pads. For example, a voltage would be applied between contact pads $18a''$ and $26a''$ to create conductive filament $30a''$, and then subsequently a voltage would be applied between contact pads $18b''$ and $26b''$ to create conductive filament $30c''$. In other embodiments, to prevent having to apply voltages individually to each of the plurality of contact pads, groups of contact pads (e.g., non-adjacent contact pads) may have voltages simultaneously applied to them. For example, a voltage may be applied to contact pads $18a''$ and $26a''$ while a voltage is simultaneously applied to contact pads $18c''$ and $26c''$. Subsequently, a voltage is applied to contact pads $18b''$ and $26b''$ to create conductive filament $30b''$. In this way, voltage-guided conductive filaments are created despite mis-alignments between the respective contact pads.

The embodiment shown in FIG. 2C illustrates the creation of conductive filaments $30a'''$-$30c'''$ between contact pads $18a'''$-$18c'''$ and $26a'''$-$26c'''$, respectively, and in particular the creation of conductive filaments between contact pads having different sizes and/or geometries. For example, in the embodiment shown in FIG. 2C, contact pads $18a'''$-$18c'''$ are larger in size (e.g., surface area) than contact pads $26a'''$-$26c'''$. Despite this difference in size—and as result, alignment—of the respective contact pads, voltage-guided conductive filaments $30a'''$-$30c'''$ are created between the respective contact pads via application of the requisite voltage between respective contact pads. For example, application of the requisite voltage between contact pad $18a'''$ and contact pad $26a'''$ results in creation of voltage-guided conductive filament $30a'''$ along the path of least resistance (e.g., approximately shortest path). Once again, external voltages can be applied between each of the pair of contact pads simultaneously or in some order to prevent undesirable interaction between voltages applied to adjacent contact pads. In each of the embodiments described with respect to FIGS. 2A-2c, the creation of voltage-guided conductive filaments is guided between the respective contact pads based on the external voltage applied between the respective contact pads. In this way, mis-alignment between the pads or differences in pad geometry are mitigated by the fact that the conductive filaments are created on a path of least resistance (e.g., approximate shortest path) between the respective contact pads.

FIGS. 3A-3D illustrate the stacking of a plurality of semiconductor dies according to an embodiment of the present invention. In the embodiment shown in FIGS. 3A-3D, a first pair of semiconductor dies 40—having already been fabricated, adhered to one another, and with voltage-controlled conductive filaments created between respective individual semiconductor dies 44 and 46—is stacked on top of a second pair of semiconductor dies 42—also having already been fabricated, adhered to one another, and with voltage-controlled conductive filaments created between respective individual semiconductor dies 50 and 52. As a result of this process, a total of four semiconductor dies (i.e., semiconductor dies 44, 46, 50, and 52) are stacked on top of one another. As will become apparent, through the process illustrated in FIGS. 3A-3D, fewer or more semiconductor dies may be stacked on top of one another as required by the particular application.

Figure 3A:
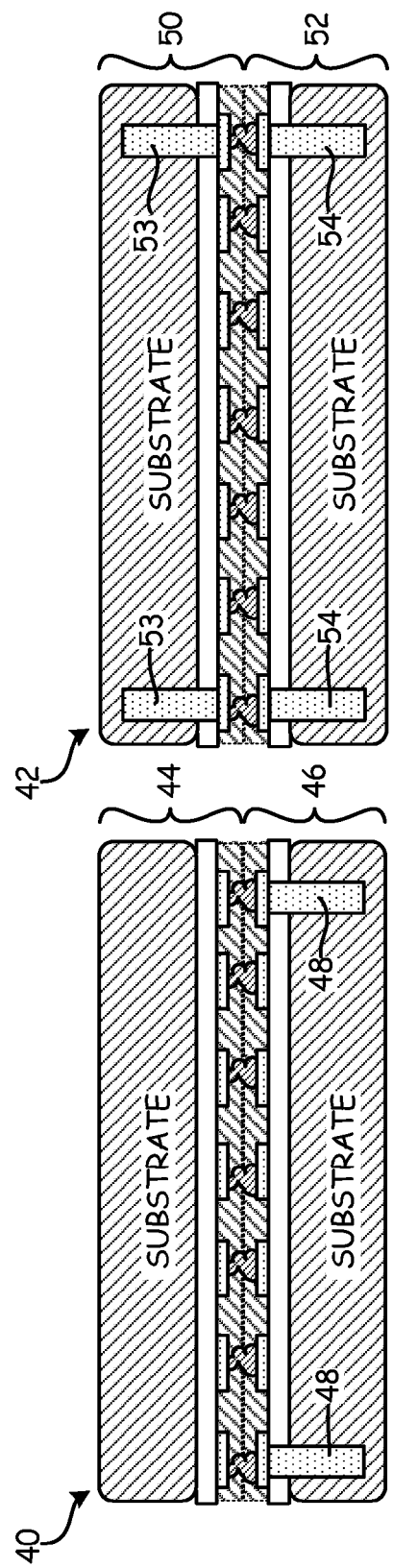
FIGS. 3A-3D illustrate stacking a plurality of semiconductor dies through use of voltage-guided conductive filament growth according to embodiments of the present invention.

FIG. 3A illustrates first and second pairs of semiconductor dies 40 and 42. First pair 40—shown on the left—includes dies 44 and 46. For the sake of clarity, components of each of the plurality of semiconductor dies are not individually labeled. However, in the embodiment shown in FIGS. 3A-3D, first semiconductor die 44 includes a substrate layer, integrated circuit layer, contact pads, and a dielectric layer. Similarly, second semiconductor die 46 includes a substrate layer, integrated circuit layer, contact pads, and a dielectric layer. In addition, second semiconductor die 46 includes conductive through vias 48 extending from the contact pads into the substrate portion. In the embodiment shown in FIG. 3A, voltage-controlled conductive filaments have already been created between respective contact pads on the first and second semiconductor dies 44 and 46.

Second pair 42—shown on the right—includes second and third semiconductor dies 50 and 52. For the same reasons discussed above, individual components of third and fourth semiconductor dies 50 and 52 are not shown. In the embodiment shown in FIGS. 3A-3D, third semiconductor die 50 includes a substrate layer, integrated circuit layer, contact pads, and a dielectric layer. Similarly, fourth semiconductor die 52 includes a substrate layer, integrated circuit layer, contact pads, and a dielectric layer. Once again, voltage-controlled conductive filaments have already been created between respective contact pads on the third and fourth semiconductor dies 50 and 52.

In addition, both third and fourth semiconductor dies 50 and 52 include conductive through-vias 53 and 54, respectively, extending from respective contact pads into respective substrates. The additional conductive through-vias in both the top and bottom semiconductor die (e.g., third and fourth semiconductor dies) allow for connections to be made in both directions from the second pair of semiconductor dies. This is in contrast with first pair 40, which only includes conductive through-vias 48 in second semiconductor die 46.

In the following steps, first pair of semiconductor dies 40 is stacked on top of second pair of semiconductor dies 42 to create a semiconductor device consisting of four stacked semiconductor dies. However, it will be appreciated that in other embodiments, first pair of semiconductor dies 40—consisting of first and second stacked semiconductor dies 44 and 46—may be utilized in isolation. In addition, in other embodiments, additional pairs of semiconductor dies may be included in the stacked configuration to create a semiconductor device with four or more stacked semiconductor dies.

Figure 3B:
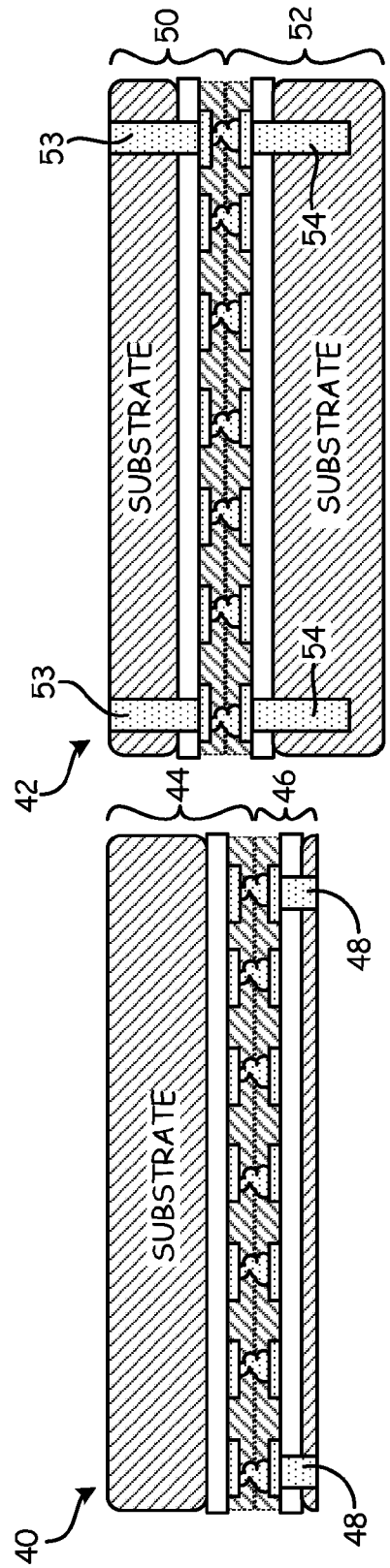
Figure 3C:
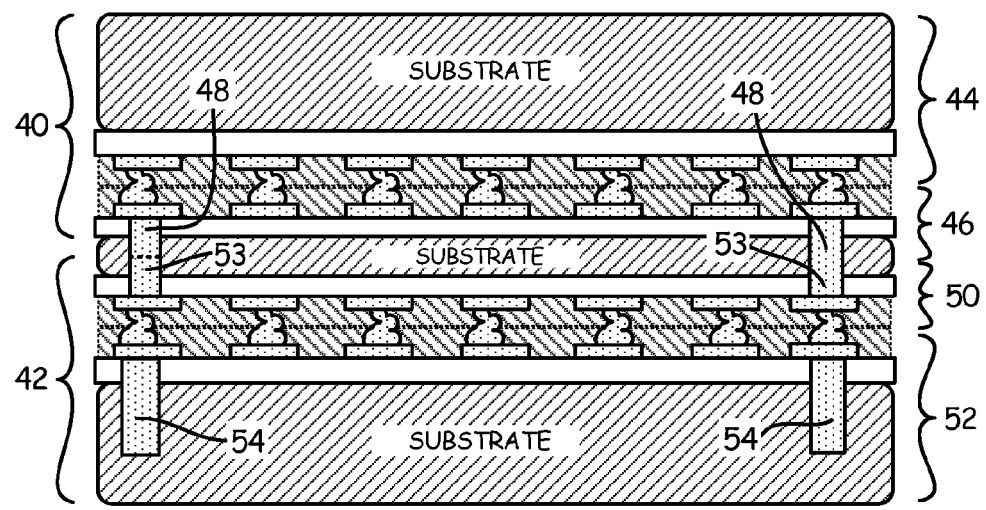

FIG. 3B illustrates the "thinning" of a substrate layer associated with each pair of semiconductor dies 40 and 42 prior to stacking. Thinning is a process by which material is removed from the substrate, resulting in exposure of the conductive through-vias. For example, in the embodiment shown in FIG. 4A, the substrate portion associated with second semiconductor die 46 is thinned to expose conductive through-vias 48. Similarly, the substrate portion associated with third semiconductor die 50 is thinned to expose conductive through-vias 53. As shown in FIG. 3C, when first pair 40 is stacked on top of second pair 42, exposed conductive through-via 48 is aligned with exposed conductive through-via 53 to allow a conductive path between the first and second pair of semiconductor dies 40 and 42.

In the embodiment shown in FIG. 3B, the substrate portion 54 remains "unthinned", despite the fact that conductive through-vias 54 will need to be subsequently exposed for connection to another pair of semiconductor dies or a printed circuit board solder ball. In some embodiments, both substrate portions associated with semiconductor dies 50 and 52 may be thinned simultaneously. However, on some embodiments the manufacturing tool utilized to thin the substrate layer requires a substrate layer on the opposite side for securing to the machine. Therefore, in some embodiments it may be necessary to delay thinning of the substrate layer associated with semiconductor die 52.

In addition, while in the embodiment shown in FIGS. 3A-3D, two pairs of semiconductor dies are being stacked together to create a semiconductor device comprised of four individual semiconductor dies, it will be appreciated that conductive through-vias 48 could be utilized in a single pair configuration for connection directly to a chip packaging device or circuit board. As discussed in more detail with respect to FIG. 3D, a solder ball or other conductive connection path may be connected to conductive through-via 48 to form a connection between the stacked semiconductor pair and a circuit board or chip package.

FIG. 3C illustrates the stacking of first pair of semiconductor dies 40 on top of second pair of semiconductor dies 42. When stacked properly, exposed conductive through-vias 48 associated with second semiconductor die 48 are aligned with exposed conductive through-vias 53 associated with third semiconductor die 50 to provide a conductive path between first and second pairs of semiconductor devices. During this stage, the respective substrate layers associated with second semiconductor device 46 and third semiconductor device 50 may be adhered to one another. For example, a thermal adhesion process may be utilized to secure the respective substrate layer to one another, and may further be utilized to ensure a strong conductive path between respective conductive through-vias.

Figure 3D:
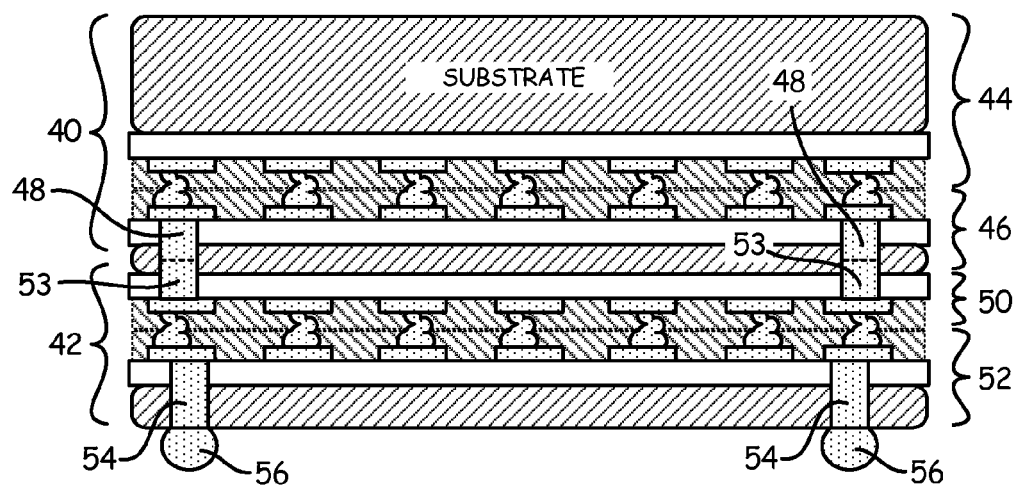

FIG. 3D illustrates the thinning of the substrate layer associated with fourth semiconductor die 52 and soldering of the stacked semiconductor device to a circuit board via solder balls 56. As discussed above, in some manufacturing processes it is only possible to thin a substrate layer if a substrate layer located opposite of the substrate layer to be thinned is available for securing to the manufacturing tool. At the manufacturing stage illustrated in FIG. 3B, the substrate layer associated with fourth semiconductor device 52 could not be thinned—at least according to this process—because the substrate layer associated with third semiconductor device 50 is too thin or otherwise in appropriate for securing to the machine. However, at the stage illustrated in FIG. 3D, the substrate layer associated with first semiconductor device 44 is available for securing to the manufacturing tool, and thus allows the substrate layer associated with fourth semiconductor device 52 to be thinned. The thinning of the substrate layer associated with fourth semiconductor die 52 exposes conductive through-vias 54 for connection to either another stacked pair of semiconductor devices or a circuit board if no other stacked pairs are required.

Having thinned the substrate layer associated with fourth semiconductor device 52, the stacked semiconductor device—consisting of four stacked semiconductor dies—can be soldered or otherwise adhered to a circuit board (not shown). In the embodiment shown in FIG. 3D, solder balls 56 are used to connect the stacked semiconductor device to, for example, a printed circuit board. In other embodiments, other well-known methods of connecting semiconductor dies to a package and/or board may be utilized.

FIGS. 4A-4C illustrate wafer fabrication and dicing according to an embodiment of the present invention. In particular, FIG. 4A illustrates first and second wafers 90 and 92, each including a plurality of individual semiconductor dies 94 and 96, respectively. FIG. 4B is a magnified view of FIG. 4A, illustrating in additional detail semiconductor dies 94a, 94b cut away from first wafer 90 and semiconductor dies 96a, 96b cut away from second wafer 92. FIG. 4C is a further magnified view illustrating in additional detail semiconductor dies 94a and 96a.

In the embodiment shown in FIG. 4A, semiconductor wafer 90 includes a plurality of individual semiconductor dies 94 organized into rows. Similarly, semiconductor wafer 92 includes a plurality of individual semiconductor dies 96 organized into rows. In one embodiment, semiconductor wafer 90 is fabricated according to a first fabrication process while semiconductor wafer 92 is fabricated according to a second fabrication process. The fabrication processes may utilize different chemicals and techniques, which may be incompatible with one another. As a result of incompatible fabrication processes, there is no opportunity to stack or layer semiconductor devices on a single wafer. For these types of applications, it is particularly beneficial to be able to stack semiconductor dies on top of one another post-fabrication. However, in other embodiments semiconductor wafers 90 and 92 may be fabricated utilizing compatible techniques.

The finished product will include a semiconductor die 94 from wafer 90 stacked on top of a semiconductor die 96 from wafer 92, with voltage-guided conductive filaments created therebetween. However, there are several different methods for assembling the stacked semiconductor device. In one embodiment, each individual semiconductor die 94 is separated via a dicing operation from the larger wafer, and stacked on an opposing semiconductor die (e.g., semiconductor die 96) similarly separated from semiconductor wafer 92, prior to adherence and creation of voltage-guided conductive filaments. In other embodiments, however, rather than separate each individual semiconductor die prior to creation of voltage-guided conductive filaments, the semiconductor wafers 90 and 92 are stacked on top of one another and voltage-guided conductive filaments are created between select groups of individual semiconductor dies 94 and 96 (e.g., along a row), prior to separation from one another via cutting operations.

FIG. 4B illustrates in more detail semiconductor dies 94a and 94b along cut line 98 prior to separation from semiconductor wafer 90, and semiconductor dies 96a and 96b along cut line 98 prior to separation from semiconductor wafer 92. In particular, with respect to semiconductor dies 94a and 94b, FIG. 4B illustrates lateral contacts 100a and 100b, respectively, extending from cut line 98 into each respective semiconductor die. In one embodiment, lateral contacts 100a and 100b are used to apply external voltages to contact pads to create conductive filaments between respective semiconductor dies. Likewise, lateral contacts 102a and 102b extend from cut line 98 into respective semiconductor dies 96a and 96b, respectively. Lateral contacts 102a and 102b are similarly used to apply external voltages to contact pads located on semiconductor dies 96a and 96b to create conductive filaments as desired. As discussed above, voltage may be applied to individual semiconductor dies (e.g., dies 94a, 94b, 96a, 96b) via lateral contacts 100a, 100b, 102a, and 102b while each dies remains a part of the larger semiconductor wafer, or subsequent to a dicing operation in which each individual die is separated from the larger semiconductor wafer.

FIG. 4C illustrates in even greater detail semiconductor die 94a and semiconductor die 96a. In particular, semiconductor die 94a is shown to include a plurality of lateral contacts 100a, a plurality of contact pads 104a, and a plurality of solder joint contact pads 106a. Likewise, semiconductor die 94b is shown to include a plurality of lateral contacts 102a, a plurality of contact pads 108a, and a plurality of solder joint contact pads 110a.

As shown in the magnified view of FIG. 4C, cut line 98 is positioned so as to cross lateral contacts 100a and 102b associated with semiconductor dies 94a and 96a, respectively, so as to expose the lines for application of a desired voltage. Once exposed, an external voltage applied to lateral contacts 100a is delivered to contact pads 104a, Likewise, an external voltage applied to lateral contacts 102a is delivered to contact pads 108a. First semiconductor die 104a and second semiconductor die 96a are placed in a stacked configuration, and once aligned either through adhesion to one another or other means, external voltages are selectively applied to contact pads 104a and 108a, respectively, via lateral contacts 100a and 102a to create the conductive filaments between the respective contact pads. Depending on the relative location of the plurality of contact pads 104a and 108a, external voltage may be applied in some order to each of the plurality of contact pads, or may be applied simultaneously to each of the plurality of contact pads. To that end, in some embodiments each lateral contact is connected to a single contact pad to allow for selective application of the external voltage to any individual contact pad, while in other embodiments each lateral contact is connected to a plurality of contact pads such that application of the external voltage is simultaneously applied to a plurality of contact pads, or all of the contact pads associated with the semiconductor die. Once the conductive filaments have been created, the external voltage is removed from conductive lines 100a and 102a.

In the embodiment shown in FIGS. 4A-4C, conductive lines used to supply the requisite external voltage to each of the plurality of contact pads is located on a side edge (e.g., the edge subject to row dicing operations), such that cutting of a previous row of semiconductor dies from the wafer exposes the lateral contacts for the next row of semiconductor dies, which at this stage may remain a part of the larger semiconductor wafer. Having exposed lateral contacts 100a, 100b, 102a, 102b for respective semiconductor dies, conductive filaments may be created while the plurality of semiconductor dies remain connected in rows. In another embodiment, each of the plurality of semiconductor dies 94 and 96 are separated into individual semiconductor die components, stacked, and provided with the requisite voltage to create the conductive filaments between the contact pads. A benefit of creating the conductive filaments while the plurality of semiconductor dies are connected as part of a single row is that it may simplify alignment between respective semiconductor dies 94 and 96. In addition, it may be more efficient to provide the external voltage necessary to each of the plurality of contact pads while included as part of a larger row, rather than individually once each semiconductor die has been separated from adjacent semiconductor dies. However, in other embodiments, it may be beneficial to separate each of the plurality of semiconductor dies 94 and 96 prior to stacking and creation of conductive filaments in order to allow testing of each individual semiconductor die. In this way, an uncorrectable defect in one of the semiconductor dies (e.g., 94 or 96) is detected prior to stacking and connection to another semiconductor die, thereby reducing scrap that would otherwise result if a bad semiconductor die was paired with and connected to a good semiconductor die. In still other embodiments, conductive filaments may be created between contact pads of each of the plurality of semiconductor dies in wafer form so long as an external voltage can be selectively applied between each of the respective contact pads.

Figure 4D:
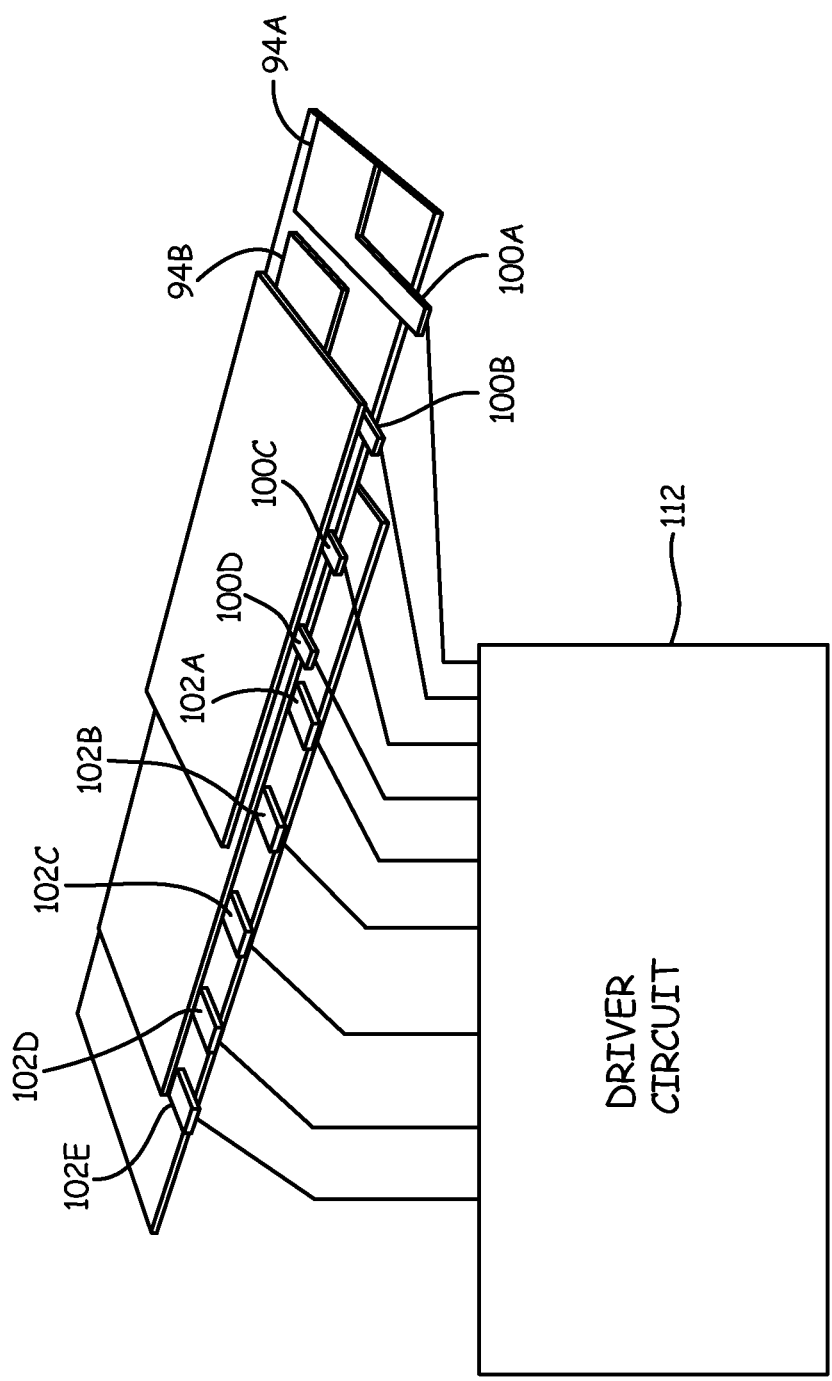
FIG. 4D is a perspective view that illustrates lateral contacts used to create voltage-controlled filaments between respective semiconductor dies according to an embodiment of the present invention.

FIG. 4D illustrates connection of driver circuit 112 to the plurality of lateral contacts 100a-100d and 102a-102e for creation of voltage-controlled conductive filaments. In the embodiment shown in FIG. 4D, driver circuit 112 is connected to a plurality of lateral contacts, such that voltage-controlled conductive filaments are created between a plurality of semiconductor dies simultaneously. In other embodiments, driver circuit 112 may be configured to created voltage-controlled conductive filaments between a pair of semiconductor dies. In addition, driver circuit 112 may include circuitry that determines the order in which voltage should be applied to each of the plurality of lateral contacts. For example, in one embodiment, voltage-controlled conductive filaments between adjacent contact pads are created at different times. Driver circuit 112 determines the order in which voltage is applied to each contact pad via lateral contacts. In one embodiment, the order is predetermined according to a program or hardware configuration.

Figure 5:
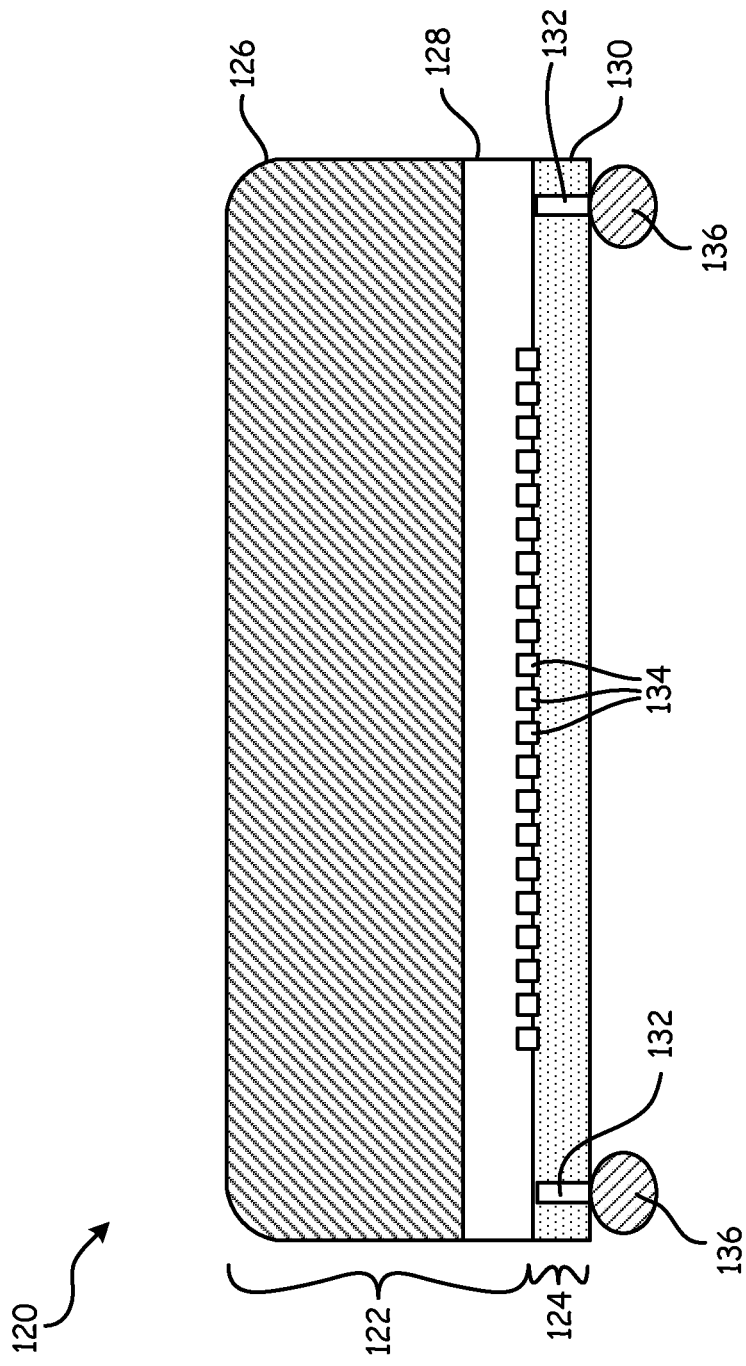
FIG. 5 is a cross-sectional view that illustrates a stacked, multi-die device according to an embodiment of the present invention.

FIG. 5 is a cross-sectional view of solid-state memory device 120 utilizing a stacked semiconductor die configuration according to an embodiment of the present invention. Solid-state memory device 120 utilizes first semiconductor die 122 and second semiconductor die 124. First semiconductor die 122 includes substrate 126 and complimentary, metal-oxide semiconductor (CMOS) layer 128 that includes the transistor logic for accessing memory cells associated with second semiconductor die 124. In the embodiment shown in FIG. 5, second semiconductor die 124 includes memory cell layer 130 and conductive through vias 132. With respect to second semiconductor die 124, memory cell layer 130 may be constructed according to any well-known solid-state memory device architectures, including Flash memory (e.g., NAND Flash, NOR Flash), Random Access Memory (RAM)-based (e.g., resistive RAM or RRAM). Memory cell layer 130 would have been fabricated on a substrate, which was subsequently removed as part of a "thinning" process to expose conductive through vias 132.

In the embodiment shown in FIG. 5, first semiconductor die 122 is aligned with second semiconductor die 124. An external voltage is applied to contact pads (not shown) on both first semiconductor die 122 and second semiconductor die 124 to create conductive filaments 134 between the respective contact pads, thereby providing electrical connections between first semiconductor die 122 and second semiconductor die 124. Soli-state memory device 120 is then connected to an external circuit board and/or chip packaging component via solder balls 136 (e.g., for micro-ball grid array connections), which contact conductive through-vias 132.

A benefit of the embodiment illustrated in FIG. 5 is that first semiconductor die 122—which includes CMOS circuitry—can be fabricated according to a first fabrication process while second semiconductor die 124—which includes solid-state memory devices—can be fabricated according to a second fabrication process that is not compatible with the first fabrication process. This allows semiconductor devices made according to different to fabrication processes to be stacked and connected to one another through densely packed contact pads. As discussed above, the contact pads required to support conductive filaments are substantially smaller than the contact pads normally required to facilitate connection between semiconductor dies post wafer-fabrication. In one embodiment, the size of the contact pads required for connection via voltage-guided conductive filaments is less than 20×20 mm. In one embodiment, the size of the contact pads may be less than 10×10 mm, and in yet another embodiment the size of the contact pads may be less than 4×4 mm.

The embodiment described with respect to FIG. 5 is an example of an application well-suited to use of conductive filaments to stack two or more semiconductor dies together. In particular, the memory device application described with respect to FIG. 5 requires semiconductor dies made according to different semiconductor fabrication processes. In the embodiment shown in FIG. 5, only a pair of semiconductor dies are stacked together, however, in other embodiments a plurality of semiconductor dies may be stacked on top of one another to build a device having the desired performance characteristics.

FIGS. 6A-6B illustrates two different methods of constructing memory devices, both of which may utilize conductive filament connections between semiconductor dies according to embodiments of the present invention. In particular, FIG. 6A illustrates four generations of memory devices, each comprised of a CMOS circuitry semiconductor die and a three-dimensional memory array semiconductor die. Each successive generation of memory device increases the size (e.g., height) of the three-dimensional memory array. For example, first generation memory device 150 includes substrate 154, CMOS circuitry 156, and three-dimensional memory device 158 connected to CMOS circuitry 156 via a plurality of voltage-guided conductive filaments (not shown). In subsequent generations of the memory device, the number of layers associated with three-dimensional memory array continues to increase, which requires that the density of the CMOS circuitry 156 utilized to access each of the plurality of memory cells continue to increase and that the density of connections between the CMOS circuitry and three-dimensional memory devices is high. Second generation memory device 160 includes substrate 164, CMOS circuitry 166, and three-dimensional memory device 168 connected to CMOS circuitry 166 via a plurality of voltage-guided conductive filaments (not shown). Third generation memory device 170 includes substrate 174 and CMOS circuitry 176—and three-dimensional memory device 178 connected to CMOS circuitry 176 via a plurality of voltage-guided conductive filaments (not shown). A benefit of utilizing voltage-guided conductive filaments to connect the CMOS circuitry to the three-dimensional memory device, is that the ability to use smaller contact pads as compared with traditional die-to-die contacts. As a result, higher density three-dimensional memory devices—such as those illustrated in later generations—can be connected via the conductive filaments to the CMOS circuitry. However, a drawback of the family of memory devices illustrated in FIG. 6A is that as the size (e.g., number of layers) associated with the memory device continues to increase, the density of the CMOS circuitry and the contact pads connected via conductive filaments must also continue to increase.

In the embodiment shown in FIG. 6B, rather than continue to increase the number of layers associated with the memory device, an increasing number of semiconductor dies are stacked on top of one another in each successive generation of memory device. For example, first generation, memory device 180 once again includes substrate 184, CMOS circuitry 186, and three-dimensional memory device 188 connected to CMOS circuitry 186 via a plurality of voltage-guided conductive filaments (not shown). However, in the second generation, rather than simply increase the number of layers associated with the thee-dimensional memory device, the second generation takes advantage of benefits obtained by stacking a plurality of integrated circuit dies on top of one another. For example, second generation memory device 190 includes substrate 192, first CMOS circuitry 194, first three-dimensional memory device 196 connected to CMOS circuitry 194 via a plurality of voltage-guided conductive filaments (not shown), second CMOS circuitry 198, and second three-dimensional memory device 200 connected to CMOS circuitry 198 via a plurality of voltage-guided conductive filaments. Voltage-guided conductive filaments may likewise be used to connect second CMOS circuitry 198 to first three-dimensional memory device 196, or alternatively, second CMOS circuitry 198 may be connected directly to first CMOS circuitry 194 via conductive through-vias. Third generation memory device 210 doubles the number CMOS circuits (labeled 212, 214, 216, and 218) and the number of three-dimensional memory devices (labeled 222, 224, 226 and 228). Once again, connections between CMOS circuits and respective three-dimensional memory devices are via voltage-guided conductive filaments. In this way, the size of the memory device is increased through stacking of a plurality of semiconductor dies, connected to one another via voltage-guided conductive filaments. A benefit of this approach, is that the density associated with CMOS circuitry does not need to continue to increase (e.g., double) with each corresponding increase in memory capacity.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A semiconductor device comprising:
   a first semiconductor die having a first and second side, the first semiconductor die including at least a first contact pad located on the first side;
   a second semiconductor die having a first and second side, the second semiconductor die including at least a second contact pad located on the first side of the second semiconductor die, wherein the first semiconductor die is stacked on the second semiconductor die and wherein the first side of the first semiconductor die faces the first side of the second semiconductor die; and
   at least one voltage-guided conductive filament located between the first contact pad and the second contact pad.

2. The semiconductor device of claim 1, wherein the first semiconductor die includes a dielectric that surrounds a portion of the first contact pad facing the second semiconductor die, and wherein the second semiconductor die includes a dielectric that surrounds a portion of the second contact pad facing the first semiconductor die.

3. The semiconductor device of claim 2, wherein the voltage-guided conductive filament is created by selectively applying a voltage between the first contact pad and the second contact pad, wherein the voltage creates the voltage-guided conductive filament through the dielectric associated with the first semiconductor die and the second semiconductor die.

4. The semiconductor device of claim 1, wherein the first contact pad has a first size and the second contact pad has a second size different than the first size.

5. The semiconductor device of claim 1, wherein the first contact pad has a first geometry and the second contact pad has a second geometry different than the first geometry.

6. The semiconductor device of claim 1, wherein a first conductive line extends from an edge of the first semiconductor die to the first contact pad and a second conductive line extends from an edge of the second semiconductor die to the second contact pad, wherein a voltage is supplied between the first contact pad and the second contact pad via the first and second conductive lines.

7. The semiconductor device of claim 1, further including:
a third semiconductor die having a first and second side, the third semiconductor die including at least a third contact pad located on the first side of the third semiconductor die, wherein the third semiconductor die is stacked on the first semiconductor die and wherein the second side of the first semiconductor die faces the first side of the third semiconductor die, wherein the first semiconductor die further includes at least a fourth contact pad located on the second side of the first semiconductor die; and
a second voltage created conductive filament located between the third contact pad and the fourth contact pad.

8. A semiconductor device comprising:
a first semiconductor die having a first and second side, the first semiconductor die including at least a first contact pad located on the first side;
a second semiconductor die having a first and second side, the second semiconductor die including at least a second contact pad located on the first side of the second semiconductor die, wherein the first semiconductor die is stacked on the second semiconductor die and wherein the first side of the first semiconductor die faces the first side of the second semiconductor die; and
at least one voltage-guided conductive filament located between the first contact pad and the second contact pad, wherein the first contact pad is comprised, in part, of an electrochemically active metal and the second contact pad is comprised of an inert metal.

9. The semiconductor device of claim 2, wherein the dielectric surrounding the first contact pad and/or the second contact pad is comprised, in part, of a solid electrolyte/dielectric material.

10. The semiconductor device of claim 8, wherein the first semiconductor die includes a dielectric that surrounds a portion of the first contact pad facing the second semiconductor die, and wherein the second semiconductor die includes a dielectric that surrounds a portion of the second contact pad facing the first semiconductor die.

11. The semiconductor device of claim 10, wherein the voltage-guided conductive filament is created by selectively applying a voltage between the first contact pad and the second contact pad, wherein the voltage creates the voltage-guided conductive filament through the dielectric associated with the first semiconductor die and the second semiconductor die.

12. The semiconductor device of claim 10, wherein the dielectric surrounding the first contact pad and/or the second contact pad is comprised, in part, of a solid electrolyte/dielectric material.

13. The semiconductor device of claim 8, wherein the first contact pad has a first size and the second contact pad has a second size different than the first size.

14. The semiconductor device of claim 8, wherein the first contact pad has a first geometry and the second contact pad has a second geometry different than the first geometry.

15. The semiconductor device of claim 8, wherein a first conductive line extends from an edge of the first semiconductor die to the first contact pad and a second conductive line extends from an edge of the second semiconductor die to the second contact pad, wherein a voltage is supplied between the first contact pad and the second contact pad via the first and second conductive lines.

16. The semiconductor device of claim 8, further including:
a third semiconductor die having a first and second side, the third semiconductor die including at least a third contact pad located on the first side of the third semiconductor die, wherein the third semiconductor die is stacked on the first semiconductor die and wherein the second side of the first semiconductor die faces the first side of the third semiconductor die, wherein the first semiconductor die further includes at least a fourth contact pad located on the second side of the first semiconductor die; and
a second voltage created conductive filament located between the third contact pad and the fourth contact pad.

* * * * *